(12) United States Patent
Symes

(10) Patent No.: US 6,304,198 B1
(45) Date of Patent: Oct. 16, 2001

(54) BITMAP FONT DATA STORAGE WITHIN DATA PROCESSING SYSTEMS

(75) Inventor: Dominic Hugo Symes, Cherry Hinton (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 09/671,122

(22) Filed: Sep. 28, 2000

Related U.S. Application Data

(62) Division of application No. 09/306,408, filed on May 6, 1999.

(30) Foreign Application Priority Data

Feb. 5, 1999 (GB) .................................................. 9902664

(51) Int. Cl.$^7$ ...................................................... H03M 7/40
(52) U.S. Cl. ............................................. 341/67; 382/232
(58) Field of Search ............................... 341/67, 106, 50, 341/65; 382/232, 246

(56) References Cited

U.S. PATENT DOCUMENTS

| 5,544,286 | 8/1996 | Laney . | |
|---|---|---|---|
| 5,600,772 | * 2/1997 | Zhou et al. | 395/170 |
| 5,691,768 | * 11/1997 | Civanlar et al. | 348/392 |
| 5,732,202 | * 3/1998 | Okamoto | 385/117 |
| 6,173,078 | * 1/2001 | Kadono | 382/238 |

FOREIGN PATENT DOCUMENTS

| 0 745 946 | 12/1996 | (EP) . |
| 2 050 019 | 12/1980 | (GB) . |
| 2 214 676 | 9/1989 | (GB) . |

\* cited by examiner

*Primary Examiner*—Peguy JeanPierre
(74) *Attorney, Agent, or Firm*—Nixon & Vanderhye P.C.

(57) ABSTRACT

Character codes 2 representing pictograph font characters 6 may be used to determine an address 8 within a variable length coded data stream 10 of pixel data for the whole font relevant to the character 6 concerned. This access is via a two level table lookup with the first table level Table 1 returning an initial offset HuffOff within the coded data stream, an average size AvSz of data for a character and a pointer TB2Off to a second table Table 2. The second table is then used to lookup an error value Err to correct an estimate of the address generated from the information in the first table using the error value Err and the position N within the second table Table 2 that led to the match. The pixel bitmaps 36 for pictograph characters 6 can be divided into smaller tiles 38 and each of these tiles given a code. The tile codes may then be Huffman coded to provide highly efficient compression of the pixel bitmap font data.

11 Claims, 6 Drawing Sheets

BITMAP FONT DATA STORAGE WITHIN DATA PROCESSING SYSTEMS

This is a divisional of application Ser. No. 09/306,408, filed May 6, 1999, now pending, the entire content of which is hereby incorporated by reference in this application.

BACKGROUND OF THE INVENTION

1. Field of the Invention

This invention relates to the storage of bitmap font data within data processing systems.

2. Description of the Prior Art

Within data processing systems text data is typically stored as a sequence of character codes. When it is desired to present the text data to a user, for example by displaying it on a screen or printing it, then it is necessary to convert each character code into a graphical form that can be presented to a user. This conversion uses font data that specifies a graphical form for each character code. One type of font data is that in which a bitmap representation of the character is stored for each character code. Such bitmaps can be relatively simply processed for display or printing.

A problem that arises in such systems is the amount of storage capacity utilised in storing the font data and any associated data for accessing that font data. The amount of memory resource consumed can be a particular problem in the case of pictograph characters (such as Chinese, Korean and Japanese characters) where the number of characters that need to be represented can be very high, e.g. a Chinese pictograph font may include 13,000 different pictograph characters.

Measures that can reduce the amount of storage capacity needed to deal with font data are strongly desirable.

SUMMARY OF THE INVENTION

Viewed from one aspect the present invention provides apparatus for mapping an A-bit code to a storage location within a memory of variable length code data representing said A-bit code, said apparatus comprising:

(i) first lookup logic responsive to a B-bit field within said A-bit code for accessing a first lookup table entry corresponding to said B-bit field within in a first lookup table, said first lookup table entry including a second lookup table offset value pointing to a region within a second lookup table containing a plurality of second lookup table entries, a variable length code offset value and an average size value;

(ii) second lookup logic responsive to a C-bit field within said A-bit code for accessing a second lookup table entry corresponding to said C-bit field within said region of said second lookup table indicated by said second lookup table offset value, said second lookup table entry including an error value;

(iii) storage location calculating logic for calculating an address within said memory of said storage location from:

(iv) said variable length code offset value;

(v) a function of said average size value and a location within said region of said second lookup table that matched said C-bit field; and (vi) said error value; and (vii) storage accessing logic for reading said variable length data from said address within said memory.

This aspect of the invention seeks to reduce the overhead associated with accessing data in the form of variable length code data representing, for example, pixel bitmaps of a character. Whilst variable length coding of pixel bitmaps can produce a high degree of compression, it raises the difficulty of how to identify which particular portion of such variable length coded data represents a given character. The invention provides an improved mechanism for identifying such a portion of variable length coded data using a first lookup table and a second lookup table in a manner that advantageously reduces the amount of storage capacity required by the tables. In particular, the invention exploits the realisation that the position of the variable length coded data corresponding to a particular character can be estimated with only the error in that estimation having to be stored for an individual character thereby reducing the overall storage capacity needed for such lookup operations.

In preferred embodiments of the invention said region of said second lookup table contains a sequence of second lookup table entries sorted according to said A-bit code value such that with said region of said second lookup table said second entries are sorted in accordance with said C-bit field.

Sorting the regions of the second lookup table in accordance with the A-bit code value gives a predictability to the way that the data is arranged within the second lookup table that can be exploited to make it more efficient to identify the particular entry within the second lookup table when searching through the region concerned.

A particularly convenient way of encoding extra information into the second table is to use the position of the entry matching the character being sought within the region of the second table as an indicator of where the corresponding variable length coded data will lie within the font data as a whole. More particularly, if the entry in the second table is the Nth entry in the region and the average size of the variable length coded data for a font character is known from the first table, then multiplying these two values can give an additional offset into the variable length coded data as a whole making the approximation to the location more accurate.

A preferred way of interpreting the character code to access the first table and the second table is to use the B most significant bits of the code to index the first table and then use the C least significant bits of the code to search for a matching entry within the region of the second table pointed to by the entry indexed within the first table.

The techniques of the present invention may be usefully employed for many different types of font, but are particularly usefull when the font is a pictograph font. Pictograph fonts typically include a high number of different characters and so the data storage requirements are a more critical concern. In addition, there are typically many gaps m the character code sequence making table lookups more difficult.

The font data may be stored in different ways. For example, the font data could be stored on non-volatile magnetic storage media, such as a computer hard disk. However, the invention is particularly suited to systems in which the font data is stored in integrated circuit memory as such integrated circuit memory is typically relatively expensive to provide and so measures that reduce the amount needed are highly advantageous.

Whilst it will be appreciated that special purpose logic circuits may be provided to perform the various functions needed to carry out the technique of the invention, in many cases the best way to embody the technique will be to use data processing logic operating under software control whereby the software configures the data processing logic to act as the various different logic elements referred to above.

Viewed from a complementary aspect the present invention provides apparatus generating mapping data for mapping an A-bit code to a storage location within a memory of variable length code data representing said A-bit code, said apparatus comprising:

(i) first lookup table generating logic for generating a first lookup table such that a B-bit field within said A-bit code indicates a first lookup table entry corresponding to said B-bit field within in a first lookup table, said first lookup table entry including a second lookup table offset value pointing to a region within a second lookup table containing a plurality of second lookup table entries, a variable length code offset value and an average size value; and (ii) second lookup table generating logic for generating a second lookup table such that a C-bit field within said A-bit code indicates a second lookup table entry corresponding to said C-bit field within said region of said second lookup table indicated by said second lookup table offset value, said second lookup table entry including an error value; wherein (iii) an address within said memory of said storage location may be calculated from:

(iv) said variable length code offset value;

(v) a function of said average size value and a location within said region (vi) of said second lookup table that matched said C-bit field; and said error value.

Viewed from another aspect the invention provides a method of mapping an A-bit code to a storage location within a memory of variable length code data representing said A-bit code, said method comprising the steps of:

(i) in response to a B-bit field within said A-bit code, accessing a first lookup table entry corresponding to said B-bit field within in a first lookup table, said first lookup table entry including a second lookup table offset value pointing to a region within a second lookup table containing a plurality of second lookup table entries, a variable length code offset value and an average size value;

(ii) in response to a C-bit field within said A-bit code, accessing a second lookup table entry corresponding to said C-bit field within said region of said second lookup table indicated by said second lookup table offset value, said second lookup table entry including an error value;

(iii) calculating an address within said memory of said storage location from:

(iv) said variable length code offset value;

(v) a function of said average size value and a location within said region of said second lookup table that matched said C-bit field; and (vi) said error value; and (vii) reading said variable length data from said address within said memory.

Viewed from another aspect the invention provides a method of generating mapping data for mapping an A-bit code to a storage location within a memory of variable length code data representing said A-bit code, said method comprising the steps of:

(i) generating a first lookup table such that a B-bit field within said A-bit code indicates a first lookup table entry corresponding to said B-bit field within in a first lookup table, said first lookup table entry including a second lookup table offset value pointing to a region within a second lookup table containing a plurality of second lookup table entries, a variable length code offset value and an average size value; and (ii) generating a second lookup table such that a C-bit field within said A-bit code indicates a second lookup table entry corresponding to said C-bit field within said region of said second lookup table indicated by said second lookup table offset value, said second lookup table entry including an error value; wherein (iii) an address within said memory of said storage location may be calculated from:

(iv) said variable length code offset value;

(v) a function of said average size value and a location within said region of said second lookup table that matched said C-bit field; and said error value.

A further aspect of the invention provides apparatus for decompressing pictograph font data for a pictograph character, uncompressed data for said pictograph character being in the form of an N by M pixel bitmap, said apparatus comprising:

(i) an entropy decoder for entropy decoding a plurality of entropy codes each representing a P by Q pixel bitmap to generate a plurality P by Q pixel bitmaps for said pictograph character; and (ii) logic for combining said plurality of P by Q pixel bitmaps to generate aid N by M pixel bitmap for said pictograph character.

As mentioned above, pictograph fonts typically have very high numbers of characters. Furthermore, each individual character may be highly complex in shape so requiring a relatively detailed bitmap to properly represent it. The invention recognises that whilst pictograph characters may be highly complex in shape, there is in practice considerable redundancy within their form and that, if the characters are divided into smaller tiles, then certain forms of tile occur many times more frequently than others. The invention exploits this phenomenon by using entropy coding to represent each tile such that commonly occurring tiles can be given small entropy code with infrequently occurring tiles being given longer entropy codes. In this way, an increased degree of data compression can be achieved compared to merely raster scanning the character bitmap and compressing the bit stream resulting therefrom. Huffman coding is a particularly suitable form of entropy encoding to use for this purpose.

An aspect ratio of two to one for the P by Q pixel bitmap tiles has been found to be particularly suitable. Individual pictograph character bitmaps having a size of 16 by 16 pixels or 24 by 24 pixels provide a good compromise between the detail that is able to be displayed and the amount of storage capacity needed.

In an analogous way to the discussion mentioned above, it will be appreciated that the Huffman decoder and the logic for combining required by the decompression technique of the invention may conveniently be provided by a general purpose data processor operating under software control.

Viewed from a complementary aspect the present invention provides apparatus for compressing pictograph font data for a pictograph character, uncompressed data for said pictograph character being in the form of an N by M pixel bitmap, said apparatus comprising:

(i) logic for dividing said N by M pixel bitmap for said pictograph character to generate a plurality of P by Q pixel bitmaps; and (ii) a entropy encoder for entropy encoding each of said plurality P by Q pixel bitmaps for said pictograph character as an entropy code to generate a plurality of entropy codes representing said pictograph character.

Viewed from another aspect the present invention provides a method of decompressing pictograph font data for a pictograph character, uncompressed data for said pictograph character being in the form of an N by M pixel bitmap, said method comprising the steps of:

(i) entropy decoding a plurality of entropy codes each representing a P by Q pixel bitmap to generate a plurality P by Q pixel bitmaps for said pictograph character; and (ii) combining said plurality of P by Q pixel bitmaps to generate said N by M pixel bitmap for said pictograph character.

Viewed from another aspect the present invention provides a method of compressing pictograph font data for a pictograph character, uncompressed data for said pictograph character being in the form of an N by M pixel bitmap, said method comprising the steps of:

(i) dividing said N by M pixel bitmap for said pictograph character to generate a plurality of P by Q pixel bitmaps; and (ii) entropy encoding each of said plurality P by Q pixel bitmaps for said pictograph character as an entropy code to generate a plurality of entropy codes representing said pictograph character.

It will be appreciated that whilst the table indexing arrangement and the tiling with entropy coding could be used separately, they together provide a particularly improved system.

The above, and other objects, features and advantages of this invention will be apparent from the following detailed description of illustrative embodiments which is to be read in connection with the accompanying drawings.

DETAILED DISCUSSION OF PREFERRED EMBODIMENTS

Figure 1:
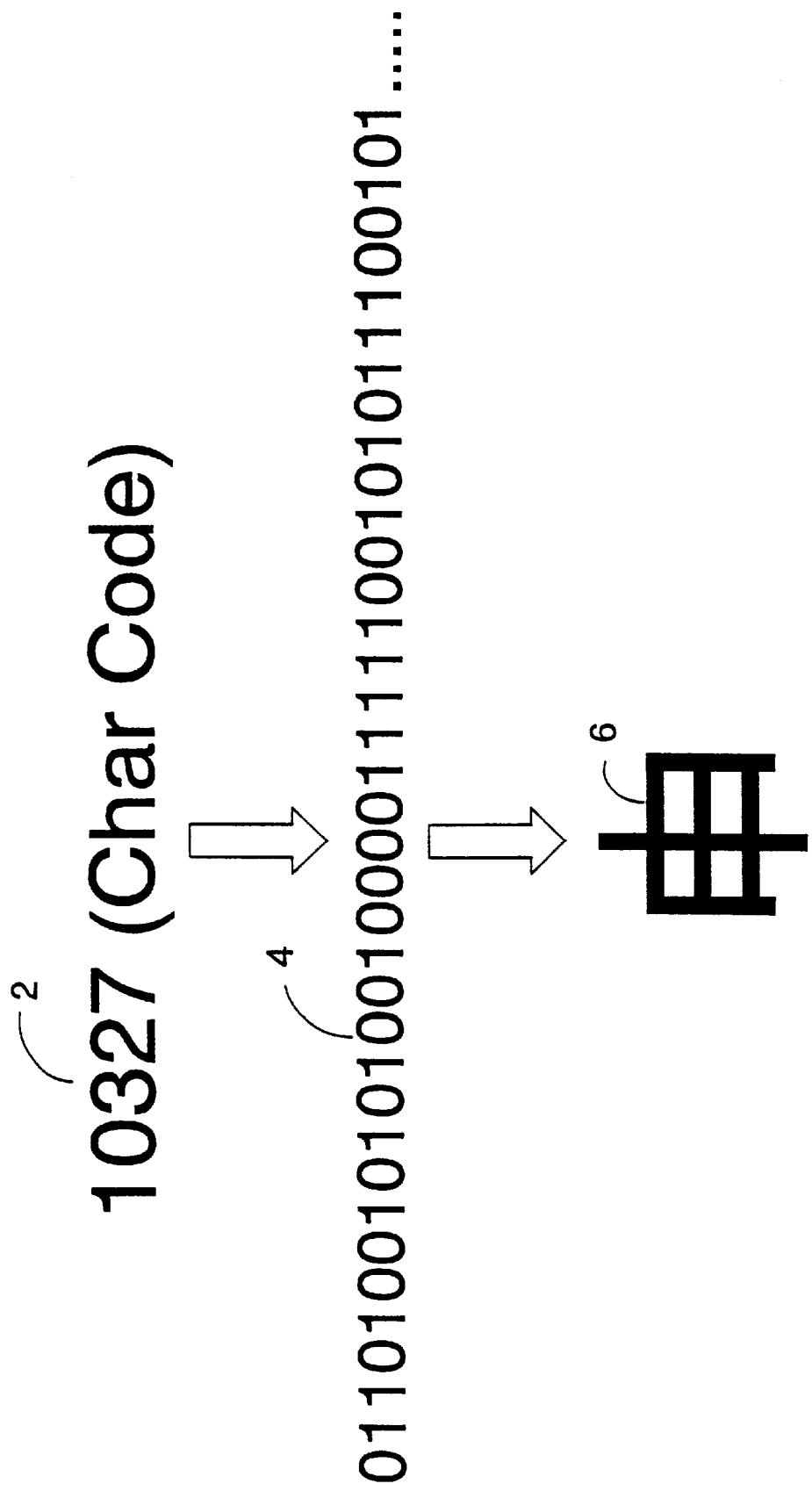
FIG. 1 illustrates the relationship between a font character code, variable length coded data for that font character code and a visual representation of that font character code.

FIG. 1 illustrates a character code 2 representing a font character within a pictograph font. The pictograph font is a Chinese character font and may typically include approximately 13,000 characters. For this reason, a two byte character code 2 is employed.

The character code 2 may be mapped to variable length coded data 4 representing a bitmap of the Chinese pictograph character 6 concerned. When this variable length coded data 4 is decoded (e.g. Huffman decoded, mapped to component tiles and combined to form a character), then the Chinese pictograph character 6 represented may be displayed or printed.

Figure 2:
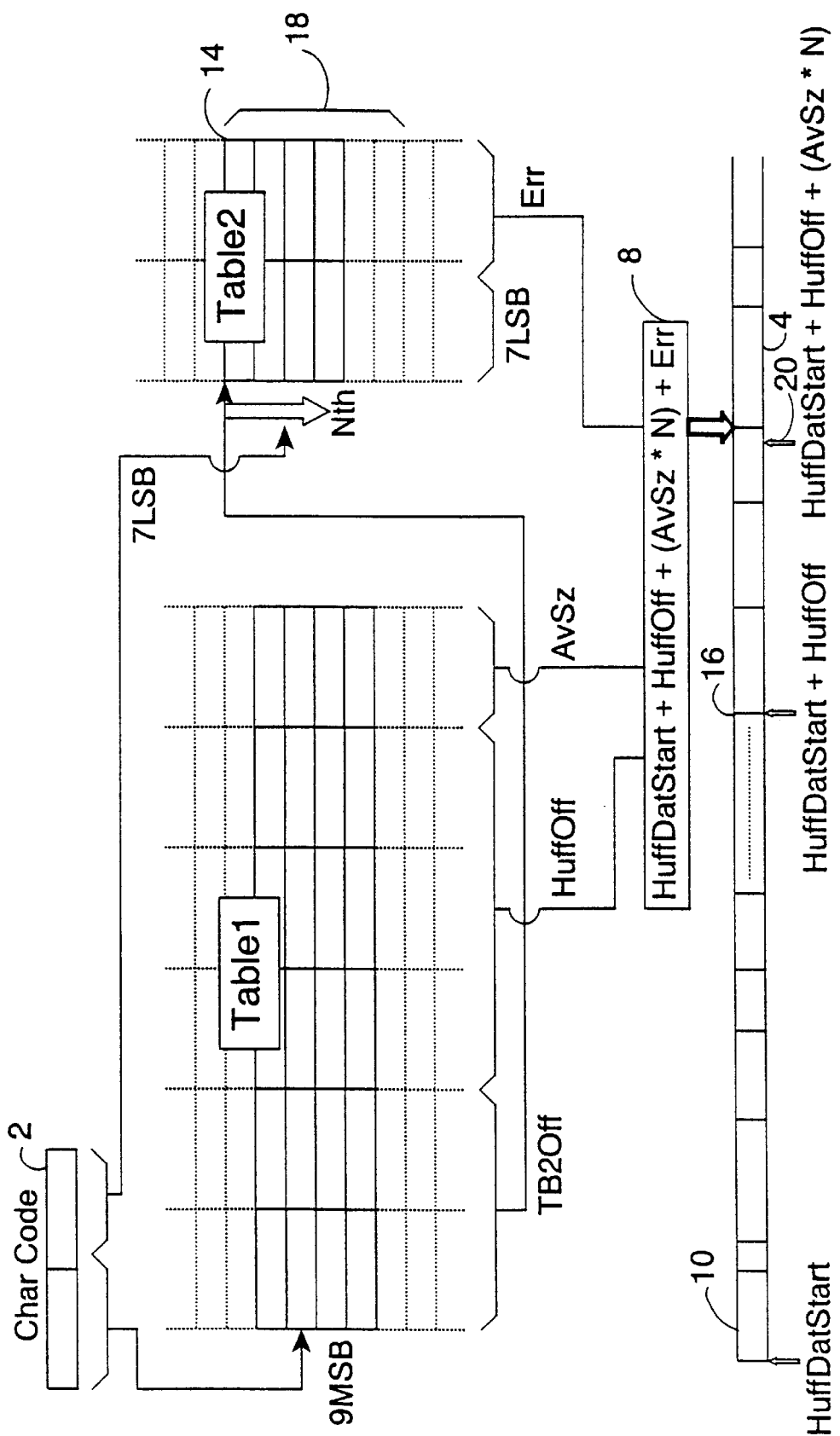
FIG. 2 illustrates a technique for mapping an A-bit font character code to a storage location within a memory holding variable length coded data representing a pixel bitmap of that character.

When the pixel bitmap data representing the pictograph characters is variable length coded, the system must determine where within this variable length coded data stream the particular data 4 corresponding to a particular character code 6 is to be found. FIG. 2 illustrates a technique for performing this mapping.

A two byte character code 2 needs to be mapped to a start position 8 within a stream of Huffman coded data 10 representing the pixel bitmaps for all of the pictograph characters within the font. The variable length coded data 4 for the particular character concerned forms a small part of the total variable length coded data 10.

The first stage in the process is to use the 9 most significant bits (B-bit field) of the character code 2 (A-bit character code) to index into Table 1. Table 1 is a 512 entry table with six bytes of data in each row. Accordingly, the 9 most significant bits 9MSB of the character code 2 can be used to directly index to a row entry within Table 1.

The first two bytes from the indexed row in Table 1 provide an offset value TB2Off pointing to a location within a second table Table 2. The next three bytes within the row of Table 1 provide a Huffman offset value HuffOff pointing to an initial offset value within the stream of Huffman coded data 10. The final byte within the index row of Table 1 gives an average size value AvSz for those pictograph characters having the 9 most significant bits corresponding to that row within Table 1.

The Table 2 offset value TB2Off is used to point to a starting location 14 of a region 18 correspond to the value 9MSB within Table 2. The entries within Table 2 comprise two byte rows. The first seven bits of a two byte row are used to match against a corresponding 7 least significant bits 7LSB of a character code 2. The remaining 9 bits within a Table 2 row provide a signed error value Err.

Knowing the start point 14 in Table 2, the start point of the next region in Table 2 can also be read from the next entry in Table 1. This yields the range within Table 2 where any matching entry will be found. This range is then binary searched by comparing the 7 least significant bits of the character code 2 with the most significant 7 bits of the entry in Table 2 at the midpoint of the range being searched. The midpoint entry could match or alternatively it can be determined whether any matching entry will be above or below the current midpoint being tested. If the midpoint did not match, then a new midpoint of the identified region above or below will be used for the next test. This process repeats until a match is found or it is determined that no valid entry for that code is present in Table 2.

Alternatively, starting from the start point 14 in Table 2, a search is made down the entries in Table 2 until an entry is found for which the 7 least significant bits of the character code 2 match the most significant seven bits of the entry.

The entry in Table 2 that produces a match will be the Nth row. The entries within Table 2 may be sorted within each region corresponding to the 9 most significant bits of a character code to run in the order of the 7 least significant bits of valid character codes that are possible. When the row within Table 2 is found corresponding to the character code 2, then the error value Err for that row may be read.

If the Huffman coded data stream 10 is stored in a memory starting from an address HuffDataStart, then the first level of approximation for finding the position of the data corresponding to the character code 2 is achieved by adding the Huffman offset value HuffOff to the start address.

This will point to a position 16 starting from where the Huffman coded data for the characters having the 9 most significant bits in common with the character code 2 are stored. Table 1 also gives the average size value AvSz for the character codes having those 9 most significant bits. Accordingly, when the search in Table 2 is made and it is determine that the Nth row in the region 18 is the one matching the 7 least significant bits of the character code, then a second level of approximation to the start address of the data 4 may be made by adding (AvSz*N) to the address 16 to obtain an address 20. The final address 8 can be obtained by adding the error value Err for the character code 2 read from Table 2 to the address 20.

Figure 3:
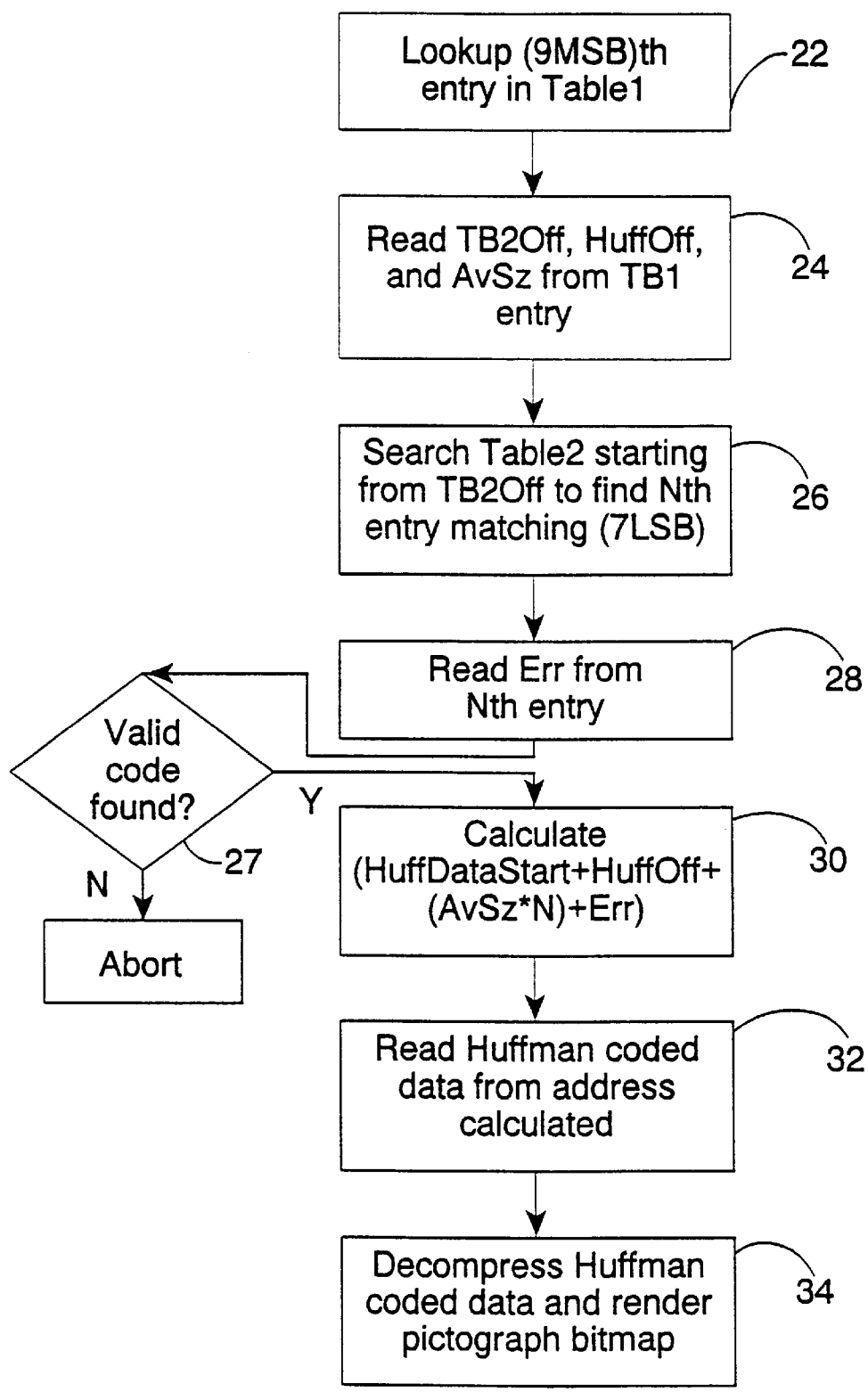
FIG. 3 is a flow diagram illustrating the operation of the system of FIG. 2.

FIG. 3 is a flow diagram illustrating the process shown in FIG. 2. At step 22 a lookup operation is performed in Table 1 using the 9 most significant bits of the character code 2 to index to a row within Table 1.

At step 24 a Table 2 offset value TB2Off, a Huffman offset value HuffOff and an average size value AvSz are all read from the indexed row within Table 1.

At step 26 a search is made in Table 2 starting from the position given by TB2Off to find the entry (Nth starting from the top of the region indicated by Table 1) matching the 7 least significant bits of a character code 2.

At step 27 a test is made as to whether a valid matching entry has been found in Table 2. If a valid matching entry has not been found, then the processing aborts.

At step 28 the error value Err is read from the Nth entry identified at step 26.

At step 30 an address of the Huffman coded variable length data is calculated using the start address HuffDataStart within the memory of the Huffman data stream 10 added to the values HuffOff, (AvSz*N) and Err. This calculated value points to the start location 8 of the Huffman coded data 4 for the character code 2.

At step 32 the Huffman coded data 4 is read from the calculated address.

At step 34 the Huffman coded data 4 is decompressed and the pictograph bitmap representation 6 of the character is rendered.

Figure 4:
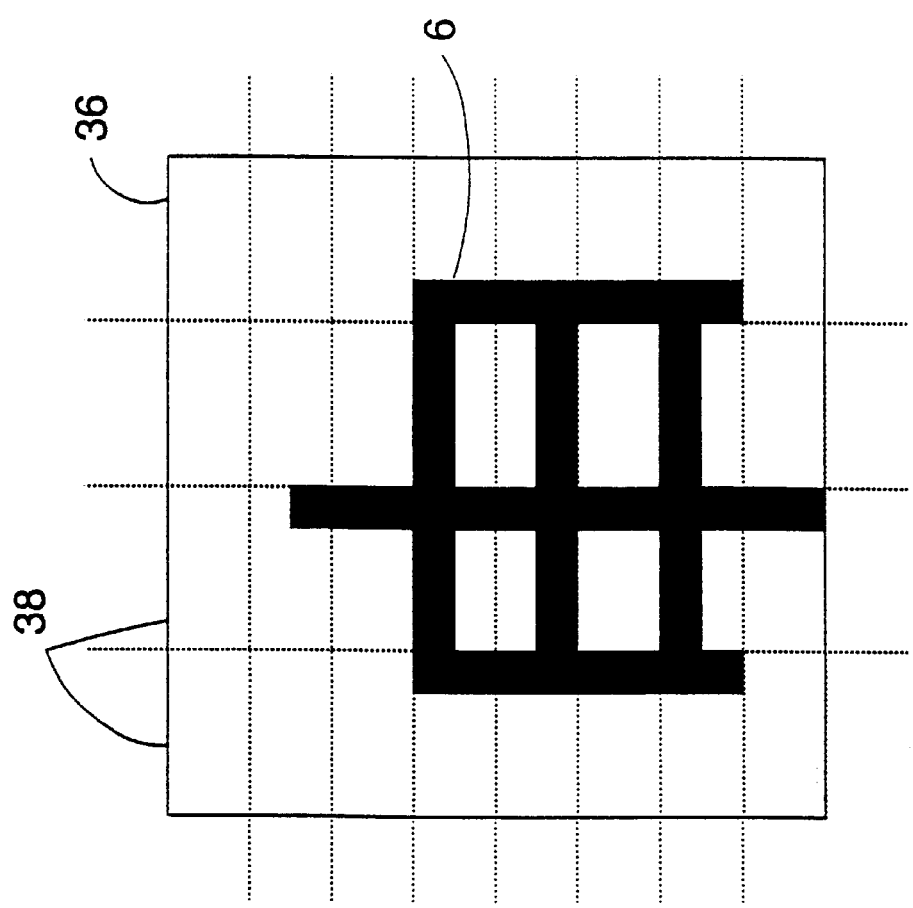
FIG. 4 illustrates a pictograph character bitmap and its division into tiles prior to Huffman coding.

FIG. 4 shows a N by M bitmap 36 representing a pictograph character 6. In this example the bitmap is a 16 by 16 pixel bitmap. In higher resolution systems a 24 by 24 pixel bitmap may be used.

The pixel bitmap 36 is divided into 32 four by two pixel tiles 38. Each of these tiles can be uniquely identified by a 8-bit code as there are 256 possible variations in the tile.

The invention exploits the realisation that some of the tile patterns are very much more common than others. Accordingly, the 8 bit codes representing the tiles 38 may be replaced by Huffman codes, with the frequently occurring tiles being given the short Huffman codes. In this way, an efficient compression of pictograph pixel bitmap font data can be made.

Figure 5:
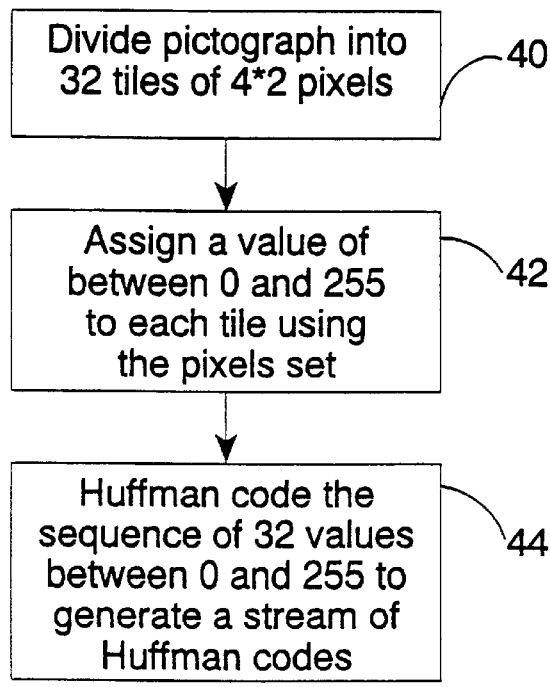
FIGS. 5 and 6 are flow diagrams respectively illustrating the compression and decompression of a pictograph character.

FIG. 5 is a flow diagram illustrating the compression of a pictograph character. At step 40 the 16 by 16 pixel bitmap is divided into 32 tiles of 4 by 2 pixels. At step 42 each of these tiles is assigned its corresponding code value between 0 and 255. At step 44, the 32 values between 0 and 255 are Huffman coded using a Huffman coding table for the whole font to generate a corresponding stream of Huffman codes. This stream of Huffman codes is a variable length coded representation of the 16 by 16 pixel bitmap 36.

Figure 6:
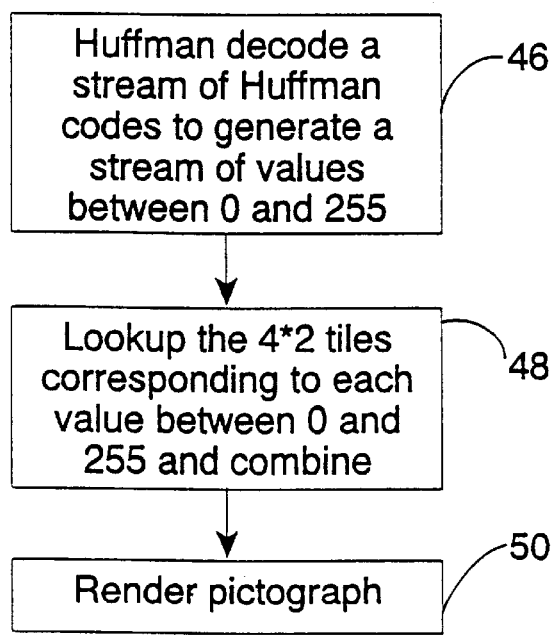

FIG. 6 is a flow diagram illustrating the decompression of Huffman coded font data for a pixel bitmap of a pictograph character. At step 46 the stream of Huffman codes is decoded to generate a stream of 32 values between 0 and 255. These 8 bit values each correspond to a particular pixel pattern for a 4 by 2 pixel tile. At step 48 these pixel patterns are looked up and combined in a preset order (e.g. a horizontal raster order of eight horizontal lines each including four tiles). This assembles the 16 by 16 pixel bitmap 36 and this may be rendered (e.g. displayed or printed) at step 50.

Figure 7:
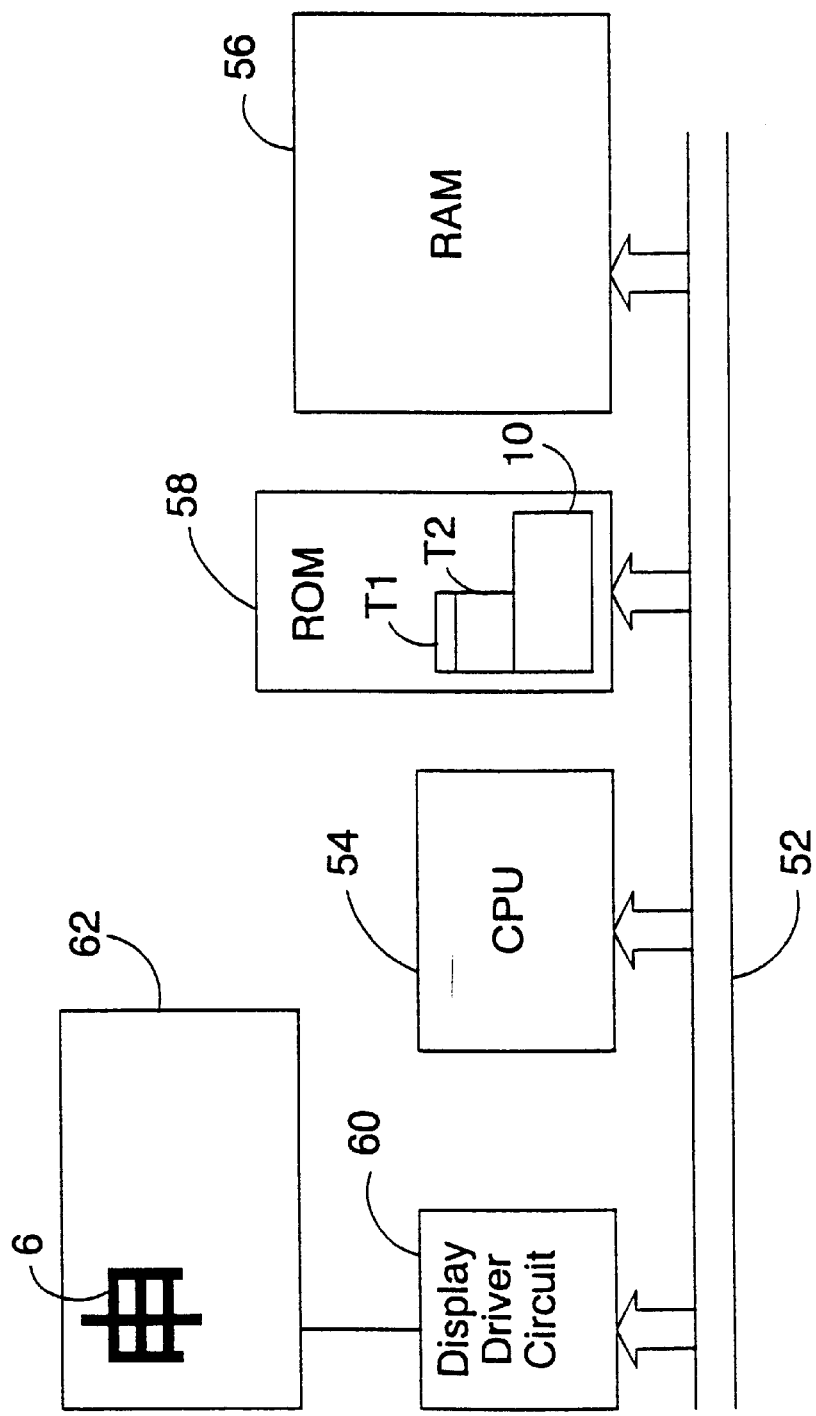
FIG. 7 illustrates a general purpose data processing system for performing the techniques described in relation to FIG. 1 to 6.

FIG. 7 illustrates a typical data processing system that may be used to implement the techniques described above. A common bus 52 links a central processing unit 54, a random access memory 56, a read only memory 58 and a display driver circuit 60. A display 62, such as a liquid crystal display panel, is driven by the display driver circuit 60.

In operation, software stored within the read only memory 58 may be executed by the central processing unit 54 to carry out the techniques described above. The system illustrated in FIG. 7 operates to perform the role of the various logic elements previously described.

The read only memory 58 also stores the Huffman coded font data 10, the first table Table 1 and the second table Table 2.

When the pixel bitmap 36 for the pictograph character has been decoded by the central processing unit 54, it may be sent to the display driver circuit 60 which in turn will provide the necessary signals to the display 62 to display the pictograph character 6 to a user.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for decompressing pictograph font data for a pictograph character, compressed data for said pictograph character being in the form of an N by M pixel bitmap, said apparatus comprising:
   (i) an entropy decoder for entropy decoding a plurality of entropy codes each representing a P by Q pixel bitmap to generate a plurality P by Q pixel bitmaps or said pictograph character; and
   (ii) logic for combining said plurality of P by Q pixel bitmaps to generate aid N by M pixel bitmap for said pictograph character.

2. Apparatus as claimed in claim 1, wherein said entropy decoder is a Huffman decoder and said entropy codes are Huffman codes each representing said P by Q pixel bitmap in accordance with a Huffman coding table for said pictograph font data.

3. Apparatus as claimed in claim 1, wherein said P by Q pixel bitmaps are rectangular with aspect ratio not equal to 1 to 1.

4. Apparatus as claimed in claim 3, wherein said P by Q pixel bitmaps have an aspect ratio of 2 to 1.

5. Apparatus as claimed in claim 4, wherein P is 4 and Q is 2.

6. Apparatus as claimed in claim 1, wherein N is 24 and M is 24.

7. Apparatus as claimed in claim 1, wherein N is 16 and M is 16.

8. Apparatus as claimed in claim 1, wherein said entropy decoder and said logic for combining are provided by a data processing logic operating under software control.

9. Apparatus for compressing pictograph font data for a pictograph character, uncompressed data for said pictograph character being in the form of an N by M pixel bitmap, said apparatus comprising:
   (i) logic for dividing said N by M pixel bitmap for said pictograph character to generate a plurality of P by Q pixel bitmaps; and
   (ii) an entropy encoder for entropy encoding each of said plurality P by Q pixel bitmaps for said pictograph character as an entropy code to generate a plurality of entropy codes representing said pictograph character.

10. A method of decompressing pictograph font data for a pictograph character, uncompressed data for said pictograph character being in the form of an N by M pixel bitmap, said method comprising the steps of:
   (i) entropy decoding a plurality of entropy codes each representing a P by Q pixel bitmap to generate a plurality P by Q pixel bitmaps for said pictograph character; and
   (ii) combining said plurality of P by Q pixel bitmaps to generate said N by M pixel bitmap for said pictograph character.

11. A method of compressing pictograph font data for a pictograph character, uncompressed data for said pictograph character being in the form of an N by M pixel bitmap, said method comprising the steps of:
   (i) dividing said N by M pixel bitmap for said pictograph character to generate a plurality of P by Q pixel bitmaps; and
   (ii) entropy encoding each of said plurality P by Q pixel bitmaps for said pictograph character as an entropy code to generate a plurality of entropy codes representing said pictograph character.

* * * * *